(12) United States Patent
Hiblot et al.

(10) Patent No.: US 12,494,424 B2
(45) Date of Patent: Dec. 9, 2025

(54) INTERCONNECT STRUCTURE OF A SEMICONDUCTOR COMPONENT AND METHODS FOR PRODUCING THE STRUCTURE

(71) Applicant: IMEC VZW, Leuven (BE)

(72) Inventors: Gaspard Hiblot, Leuven (BE); Douglas Charles La Tulipe, Cambridge, MA (US); Anne Jourdain, Grez-Doiceau (BE)

(73) Assignee: IMEC VZW, Leuven (BE)

( * ) Notice: Subject to any disclaimer, the term of this patent is extended or adjusted under 35 U.S.C. 154(b) by 461 days.

(21) Appl. No.: 17/991,351

(22) Filed: Nov. 21, 2022

(65) Prior Publication Data

US 2023/0178478 A1 Jun. 8, 2023

(30) Foreign Application Priority Data

Nov. 26, 2021 (EP) .................................. 21210847

(51) Int. Cl.
*H01L 23/48* (2006.01)
*H01L 21/02* (2006.01)
(Continued)

(52) U.S. Cl.
CPC .... *H01L 23/5226* (2013.01); *H01L 21/02019* (2013.01); *H01L 21/76805* (2013.01);
(Continued)

(58) Field of Classification Search
CPC ............... H01L 23/5226; H01L 23/481; H01L 23/49827; H01L 21/02019;
(Continued)

(56) References Cited

U.S. PATENT DOCUMENTS

2006/0043535 A1* 3/2006 Hiatt ..................... H01L 23/481
257/E21.705
2010/0327422 A1* 12/2010 Lee ......................... H01L 24/91
257/E21.597
(Continued)

FOREIGN PATENT DOCUMENTS

EP 3 035 369 A1 6/2016
EP 3 324 436 A1 5/2018
(Continued)

OTHER PUBLICATIONS

Extended European Search Report dated Apr. 28, 2022 in European Application No. 21210847.6.

*Primary Examiner* — Jesse Y Miyoshi
*Assistant Examiner* — Andrew Chung
(74) *Attorney, Agent, or Firm* — Knobbe, Martens, Olson & Bear, LLP

(57) ABSTRACT

A method producing a nano-sized interconnect structure that electrically connects the front side of a semiconductor substrate to the back side of the substrate is provided. In one aspect, the method produces a semiconductor component such as an integrated circuit chip that includes active devices formed on the front side of the substrate, and an interconnect network such as a power delivery network on the back side of the substrate. The substrate includes a lower semiconductor layer, an intermediate layer, and an upper layer. A trench is formed through the upper layer, the material of the intermediate layer is etched from inside the trench to form a cavity at the foot of the trench, and the trench and the cavity are filled with an electrically conductive material to form a buried rail with a wide contact pad at the foot of the rail, that is, wider than the width of the rail and extending between the front and back surfaces of the intermediate layer. A nanoTSV connection is processed from the back of
(Continued)

the substrate, the nanoTSV contacting the contact pad, to thereby form the interconnect structure.

9 Claims, 5 Drawing Sheets

(51) Int. Cl.
    *H01L 21/768*     (2006.01)
    *H01L 23/498*     (2006.01)
    *H01L 23/522*     (2006.01)

(52) U.S. Cl.
    CPC .. *H01L 21/76814* (2013.01); *H01L 21/76831* (2013.01); *H01L 21/76877* (2013.01); *H01L 21/76898* (2013.01); *H01L 23/481* (2013.01); *H01L 23/49827* (2013.01)

(58) Field of Classification Search
    CPC ......... H01L 21/76805; H01L 21/76814; H01L 21/76831; H01L 21/76877; H01L 21/76898; H01L 2225/06548; H01L 2224/05009; H01L 2224/05025; H01L 2224/05087; H01L 2224/0509; H01L 2224/0557; H01L 2224/08146; H01L 23/5384; H01L 21/486

See application file for complete search history.

(56) References Cited

U.S. PATENT DOCUMENTS

| | | |
|---|---|---|
| 2015/0108605 A1 | 4/2015 | Park et al. |
| 2015/0145144 A1* | 5/2015 | McDonald .......... H01L 25/0657 257/774 |
| 2016/0027729 A1 | 1/2016 | Chen et al. |
| 2020/0105671 A1 | 4/2020 | Lai et al. |
| 2020/0135634 A1 | 4/2020 | Chiang et al. |
| 2020/0152508 A1 | 5/2020 | Jourdain et al. |
| 2020/0194567 A1 | 6/2020 | Hiblot et al. |
| 2021/0305130 A1 | 9/2021 | Cho et al. |
| 2023/0068760 A1* | 3/2023 | Huang .............. H01L 21/76877 |

FOREIGN PATENT DOCUMENTS

| | | |
|---|---|---|
| EP | 3 671 859 A1 | 6/2020 |
| WO | WO 2008/035261 A1 | 3/2008 |
| WO | WO 2018/106267 A1 | 6/2018 |

\* cited by examiner

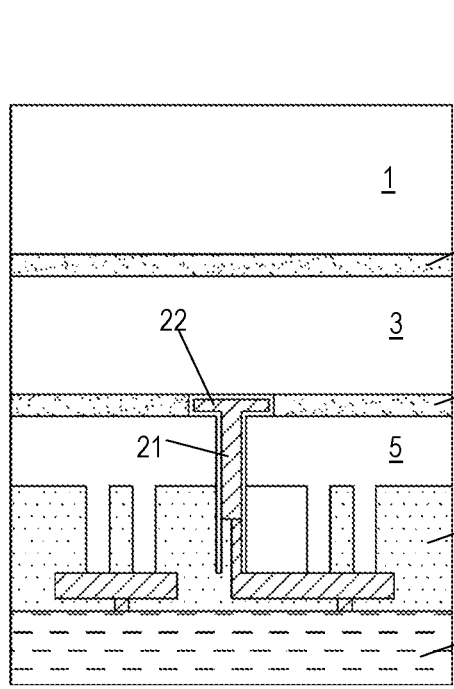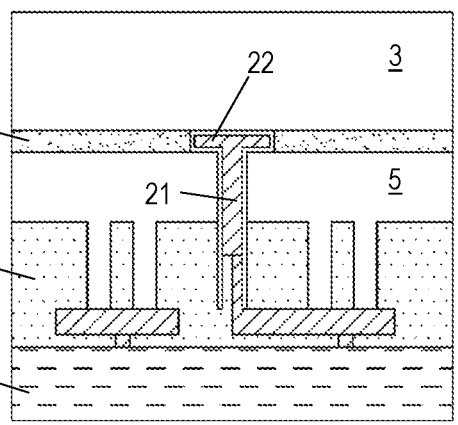
FIG. 13  FIG. 14
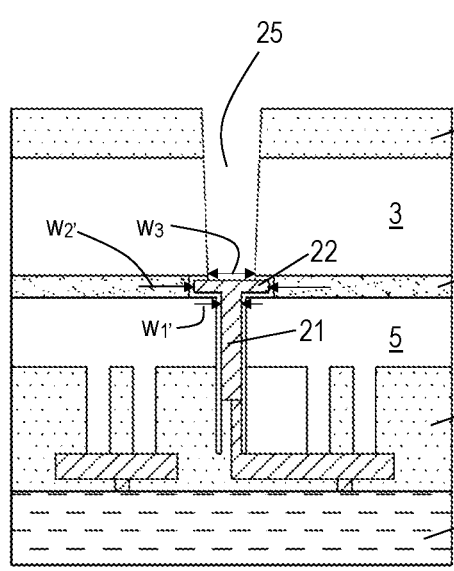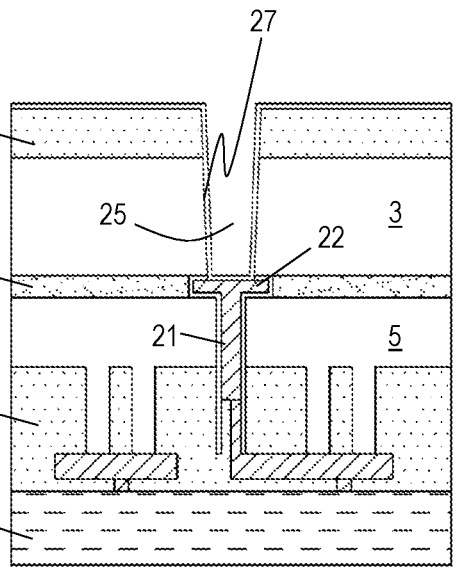
FIG. 15  FIG. 16

INTERCONNECT STRUCTURE OF A SEMICONDUCTOR COMPONENT AND METHODS FOR PRODUCING THE STRUCTURE

CROSS-REFERENCE TO RELATED APPLICATIONS

This application claims foreign priority to European Application No. 21210847.6, filed Nov. 26, 2021, which is incorporated by reference herein in its entirety.

BACKGROUND

Technological Field

The disclosed technology is related to semiconductor processing, as applied for the production of semiconductor components such as integrated circuit (IC) chips. The disclosed technology relates in particular to interconnect structures which enable the conduction of current between the front and back sides of the component.

Description of the Related Technology

Semiconductor processing for the fabrication of IC chips and other components continues to evolve towards increasing device-density: higher numbers of active devices (for example, transistors) of ever decreasing device dimensions are placed on a given surface of semiconductor material. This may cause a strain on the design and fabrication of the interconnects between the "front end of line" of the component, consisting mainly of the active devices, and the contact terminals of the component. Traditionally, all of these interconnects are incorporated in the "back end of line," a term used to indicate a stack of interconnect levels on top of the front end of line part, and includes layers of circuitry connected by vertical via connections. The power delivery network (PDN) is specifically formed by conductors and vias connected to VDD/VSS terminals of the component, for delivering power to the individual devices in the front end of line. The integration of this power delivery network in the back end of line has become particularly challenging because of the above-described increase in the device density.

A solution to this problem has been the combined application of buried power rails (BPRs) connected to the active devices and a power delivery network on the back side of the chip, as described, for example, in European Application Publication No. EP3324436A1. This application proposes to contact the buried power rails from the back side of the semiconductor substrate onto which the active devices are formed. After thinning a device wafer to thereby expose the back side of the semiconductor substrate, narrow Through Semiconductor Via connections (often called "nanoTSVs" or "nTSVs") are realized from the back side, contacting the buried power rails.

This approach, however, may encounter additional problems. The diameter of the vias produced from the back side for subsequent metal filling is generally larger than the width of the buried rails. In addition, these vias are usually covered on their sidewalls and bottom by a dielectric liner. The liner is opened at the bottom before metal filling so that the nTSV can connect to the BPR. However, as the bottom of the via is wider than the buried rail, the removal of the liner from the bottom may result in areas where the subsequently produced nTSV is shorted to the substrate, that is, no liner is present between the two.

In addition, this scheme can be vulnerable to overlay errors between the back-side processed nTSV and the front-side processed BPR. Indeed, the fabrication includes thinning and bonding steps which may deform the wafer. This may cause overlay errors, increasing the likelihood of a misalignment between the nTSV and the buried rail.

SUMMARY OF CERTAIN INVENTIVE ASPECTS

The disclosed technology aims to provide a solution to the problems described above. These and other aims are achieved by a method in accordance with the embodiments to the disclosed technology. According to a method of the disclosed technology, a nano-sized interconnect structure is produced that electrically connects the front side of a semiconductor substrate to the back side of the substrate. The method is part of a fabrication process for producing a semiconductor component, such as an integrated circuit (IC) chip that includes active devices formed on the front side of the substrate, and an interconnect network, such as a power delivery network, formed on the back side of the substrate. The substrate includes a lower semiconductor layer, an intermediate layer, and an upper layer. The method includes forming a trench through the upper layer, etching the material of the intermediate layer from inside the trench to form a cavity at the foot of the trench, and filling the trench and cavity with an electrically conductive material to thereby form a buried rail with a wide contact pad at the foot of the rail, that is, wider than the width of the rail and extending between the front and back surfaces of the intermediate layer. A nanoTSV connection is then processed from the back of the substrate, the nanoTSV contacting the contact pad, to thereby form the interconnect structure.

The wide contact pad can provide a reliably large contact area for the nanoTSV, thereby resolving the shorting issues and overlay-related problems described above.

The term "nano-sized interconnect structure" refers to a structure having dimensions in the order of nanometers or tens of nanometers, as seen in at least one cross-section through the substrate.

The disclosed technology is in particular related to a method for producing an interconnect structure of a semiconductor component, including a semiconductor substrate having a front side and a back side, the structure enabling to electrically connect the front side of the substrate to the back side, the method including the steps of:

providing a semiconductor wafer, including a base portion, an intermediate layer on top of the base portion, and an upper semiconductor layer on top of the intermediate layer, producing a trench extending through the complete thickness of the upper semiconductor layer and possibly further extending partially into the intermediate layer, removing material of the intermediate layer selectively with respect to the upper semiconductor layer, by isotropically etching the intermediate layer material from inside the trench, to thereby form a cavity at the foot of the trench, the cavity forming a lateral extension of the trench, filling the trench and the cavity with an electrically conductive material, thereby forming a buried rail and integral with the rail, a laterally extending pad at the foot of the rail, thinning the base portion from the back side until a lower semiconductor layer remains, wherein the semiconductor substrate is formed by the stack of the lower layer, the intermediate layer, and the upper layer, producing a via opening through the lower semiconductor layer, the via opening landing on the pad extending at the foot of the rail, and filling the via opening with an electrically conductive material, thereby forming the interconnect structure including the buried rail, the pad, and a TSV connection extending from the pad to the back side of the substrate.

According to an embodiment, the method further includes the steps of:

depositing a dielectric liner on the inner surfaces of the trench and of the cavity, before filling the trench and the cavity with the conductive material, and depositing a dielectric liner on the inner surfaces of the via opening, followed by removing the liner from the bottom of the via opening, before filling the via opening with the conductive material.

According to an embodiment:

the base portion of the semiconductor wafer consists of a bulk wafer, an etch stop layer on top of the bulk wafer and the lower semiconductor layer on top of the etch stop layer, wherein the etch stop layer is suitable for stopping at least one etch process applicable for the removal of the material of the bulk wafer from the back side of the bulk wafer, and the step of thinning the base portion includes
thinning the bulk wafer by a thinning sequence that ends with an etch process that stops on the etch stop layer,
removing the etch stop layer.

According to an embodiment, the upper and lower layers are silicon layers and the intermediate layer is a SiGe layer.

According to an embodiment, the upper and lower layers are silicon layers and the intermediate layer and the etch stop layer are SiGe layers.

The disclosed technology is also related to an interconnect structure of a semiconductor component including a semiconductor substrate having a front side and a back side, the structure enabling to electrically connect the front side of the substrate to the back side, wherein:

the substrate is formed as a stack of a lower semiconductor layer, an intermediate layer, and an upper semiconductor layer, the structure includes:
a rail formed inside a trench through the complete thickness of the upper layer,
a laterally extending pad at the foot of the rail, the pad extending into the intermediate layer, and
a TSV connection extending from the pad to the back side of the substrate.

According to an embodiment of the interconnect structure, the upper and lower semiconductor layers are silicon layers and the intermediate layer is a SiGe layer.

The disclosed technology is also related to a semiconductor component including one or more interconnect structures according to the disclosed technology.

The disclosed technology is also related to an integrated circuit chip including one or more interconnect structures according to the disclosed technology.

BRIEF DESCRIPTION OF THE DRAWINGS

The enclosed figures are intended to illustrate the main features of the disclosed technology. They are not drawn to scale and should not be regarded as technical drawings of real structures.

FIGS. 1 to 19 illustrate a number of steps of a method according to an embodiment of the disclosed technology.

DETAILED DESCRIPTION OF CERTAIN ILLUSTRATIVE EMBODIMENTS

In the following detailed description, a method according to the disclosed technology is described on the basis of one embodiment of the method, for producing an integrated circuit chip including a layout of finFET transistors arranged on a semiconductor substrate and connected to the back side of the chip through nTSVs and buried interconnect rails. However, the disclosed technology is not limited to this particular example. Instead of fin-based active devices, the active devices could be planar devices or nano-sheet devices. The rails may be buried power rails (BPR) or any other type of interconnect rail. Any reference to dimensions and materials applied for the various layers and areas that will be described is merely included by way of example, and is not to be understood as a limitation of the scope of the disclosed technology.

Figure 1:
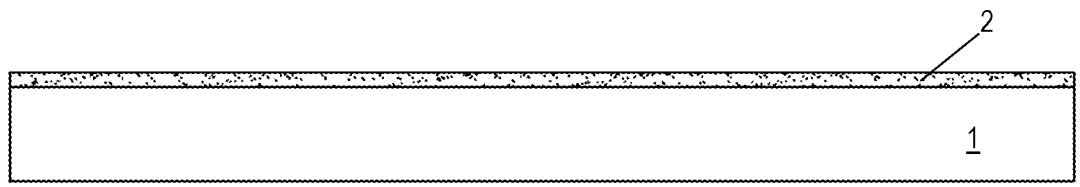

With reference to FIG. 1, a SiGe layer 2 is deposited on a bulk silicon wafer 1 which may, for example, be a process wafer of diameter 200 mm or 300 mm. The image shows only a small section of the wafer 1. The SiGe layer 2 will serve as an etch stop layer in a etch process applied later. The SiGe layer 2 may have a thickness of about 50 nm, for example. The layer 2 may be produced on the wafer 1 by epitaxial growth techniques.

Figure 2:
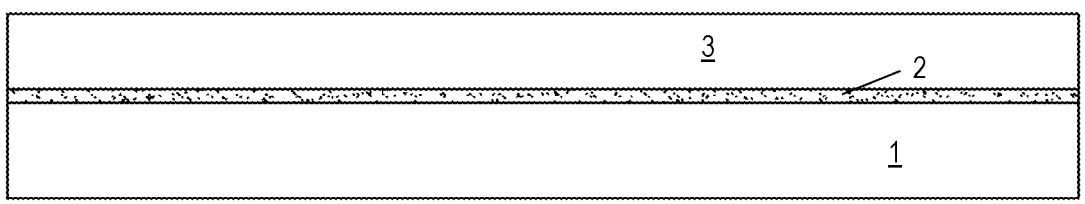

As shown in FIG. 2, a monocrystalline silicon layer 3 is then formed on the SiGe layer 2, having, for example, a thickness between 100 nm and 300 nm. The monocrystalline layer 3 may also be formed by epitaxial growth.

Figure 3:
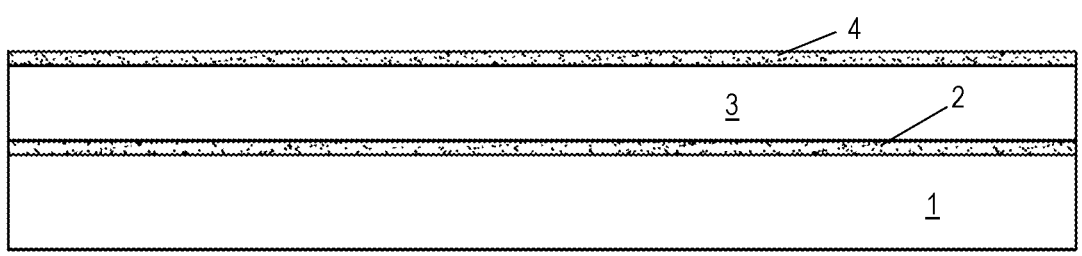
Figure 4:
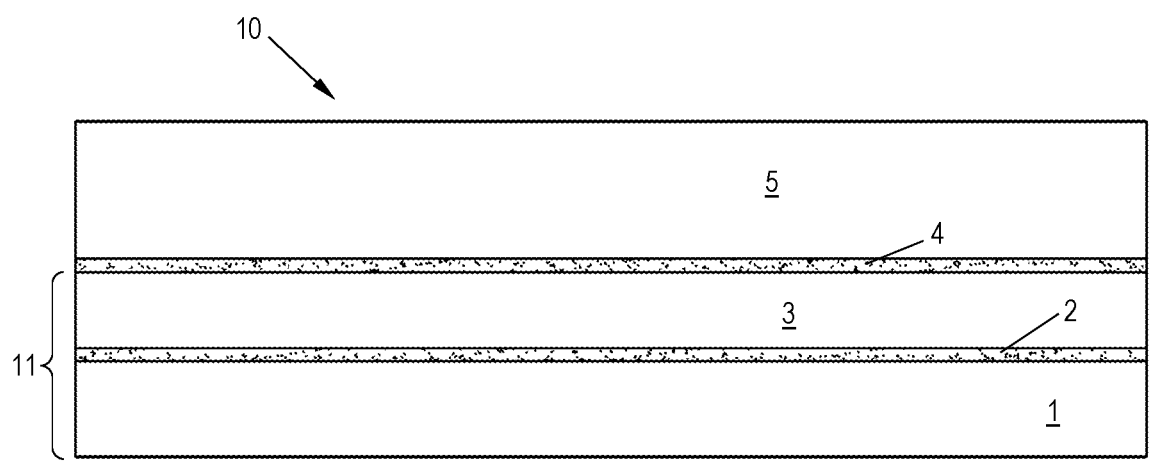

Then a second SiGe layer 4 is formed on the monocrystalline Si layer 3 (see FIG. 3), followed by another monocrystalline Si layer 5 on the second SiGe layer 4 (see FIG. 4). The second SiGe layer 4 may have about the same thickness as the first SiGe layer 2, and the second monocrystalline Si layer 5 may, for example, have a thickness within the same range of 100-300 nm as the first monocrystalline Si layer 3. Both layers 4 and 5 may be formed by epitaxial growth.

The previous steps result in a semiconductor wafer 10 including a "base portion" 11 formed of the bulk Si wafer 1, the etch stop layer 2, and the first monocrystalline Si layer 3. The "intermediate layer" is the second SiGe layer 4, and the "upper layer" is the second monocrystalline Si layer 5.

Figure 5:
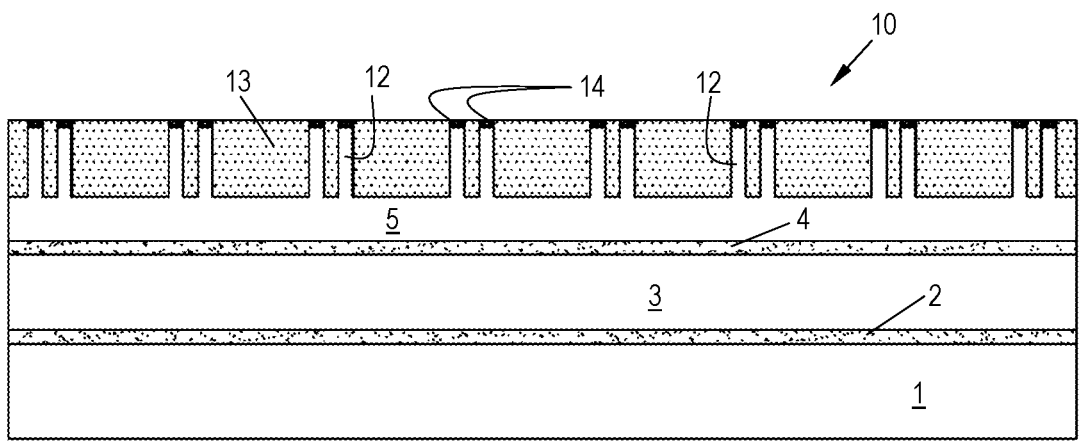

With reference to FIG. 5, the upper Si layer 5 is further processed by any suitable technique, creating a plurality of silicon fins 12, separated from each other by a dielectric material, referred to as STI layer 13 (shallow trench isolation). The fins 12 are obtained by lithography and etching, applying a hardmask 14. The width of the fins 12 may be in the order of a few nm up to a few tens of nm. The STI layer 13 may be formed of SiO2 deposited, for example, by chemical vapor deposition and planarized by mechanical thinning methods which may include CMP (chemical mechanical polishing).

Figure 6:
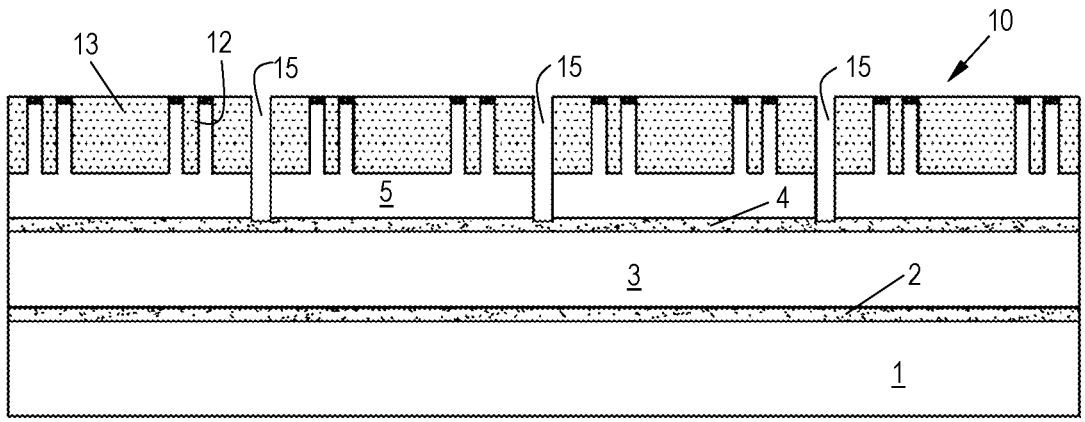
Figures 7, 8:
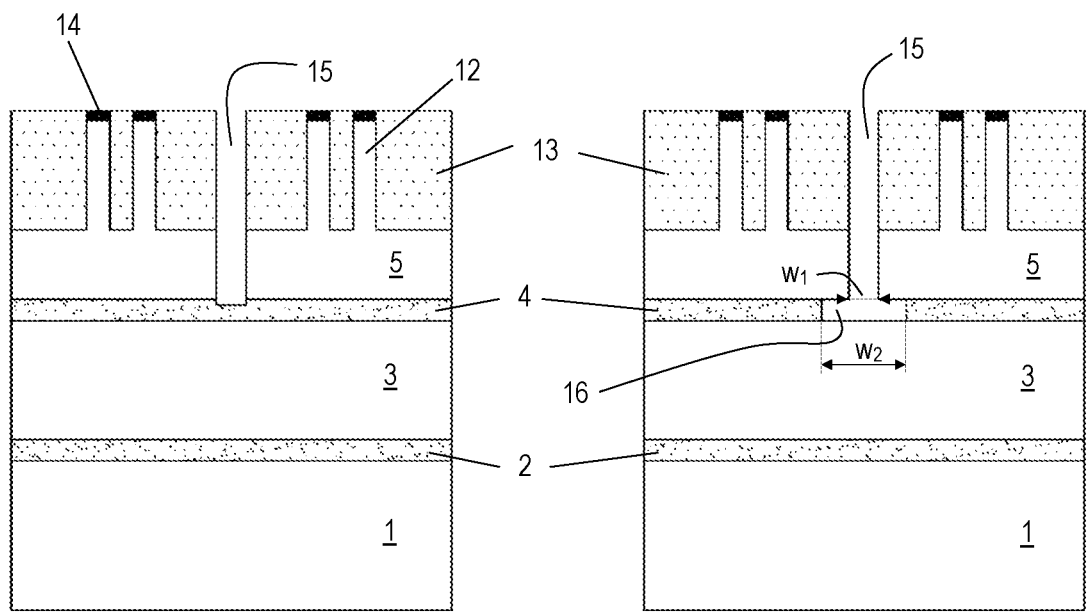

Then a number of trenches 15 are formed through the upper Si layer 5, as illustrated in FIG. 6 and in the detailed view of one of the trenches 15 shown in FIG. 7. The trenches 15 are obtained by any suitable lithography and anisotropic etching techniques in semiconductor processing, and in particular from processes applicable for the production of buried contact rails. The width of the trenches 15 as seen in the plane of the drawing may be in the order of about 5-10 nm up to a few tens of nm. The length of the trenches 15 in the direction perpendicular to the drawing may be in the order of several tens or hundreds of nanometers, depending on a particular layout that is being processed.

As shown in FIG. 7, the trench 15 extends partially into the second SiGe layer 4. This may be realized by a timed etch process that removes both Si and SiGe or by an etch process that removes Si selectively with respect to SiGe but that is not 100% selective, or by a 100% selective etch process followed by a further etch of the SiGe. Alternatively, the trench 15 may extend down to the SiGe without extending into the SiGe layer 4, by using only a 100% selective etch process or by timing the etch according to the thickness of the STI layer 13 and the upper Si layer 5.

In FIG. 7, the trench 15 has perfectly vertical sidewalls. In reality these walls may be slanted slightly towards each other, so that the width of the trench is higher at the top of the trench than at the foot of the trench.

Then an isotropic etch process is applied that removes SiGe relative to Si, resulting in the image shown in FIG. 8. The isotropic etch process removes SiGe starting from the inner surface of the trench 15 at the bottom of the trench, thereby creating a cavity 16 at the foot of the trench that extends laterally outward from the trench. Due to the selectivity of the etch process, the Si layers 3 and 5 remain essentially intact, so that the height of the cavity 16 corresponds to the thickness of the second SiGe layer 4. The etch process is timed so that the width w2 of the cavity is significantly larger than the width w1 of the trench at the foot of the trench, that is, at the transition plane between the trench 15 and the cavity 16. For example, the width w2 may be at least about twice the width w1.

Suitable etch processes for removing SiGe relative to Si can be used. For example, a wet etch process may be applied, using an HNO3:H2O:HF solution, or a dry etch using CF4 with limited influx of oxygen.

Figures 9, 10:
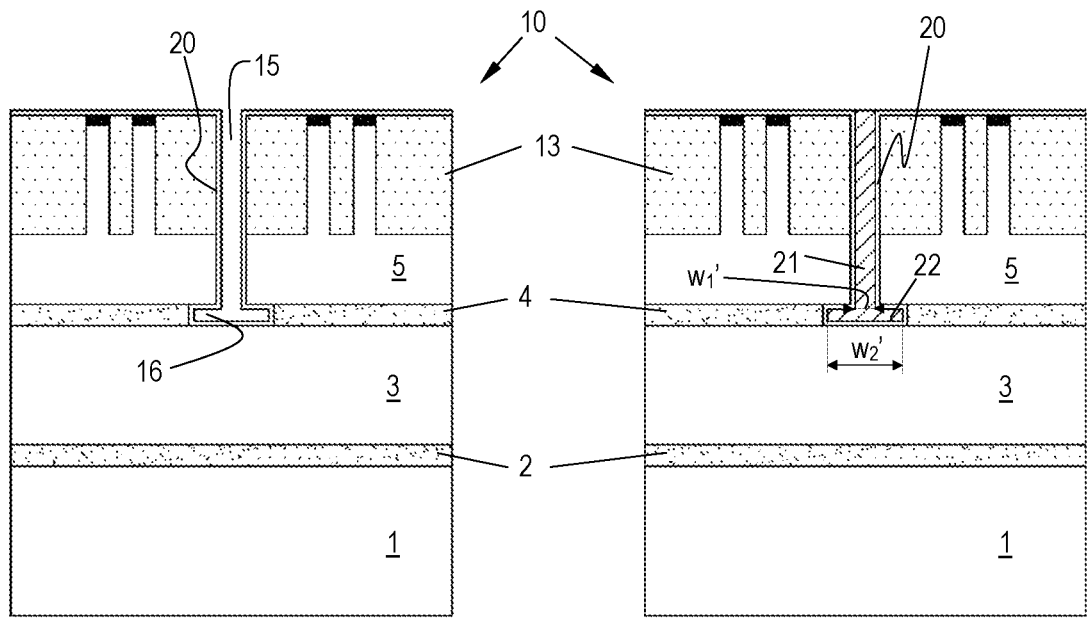

In the embodiment illustrated in the drawings, the next step is illustrated in FIG. 9 and consists in the deposition of a dielectric liner 20 on the inner surfaces of the common space formed by the trench 15 and the cavity 16 and on the upper surface of the wafer 10. The liner 20 may be a SiO2 layer of about 5 nm thick, for example, deposited by a technique of Atomic Layer Deposition (ALD), which enables the deposition of the liner material on all of the exposed surfaces, including the inner surfaces of the cavity 16.

Then an electrically conductive material is deposited, filling the cavity 16 and the trench 15, as illustrated in FIG. 10. Additional intermediate steps may be applied which are not illustrated in the drawings but can be suitably implemented, such as the prior deposition of a barrier layer and a seed layer on the inner surfaces of the trench 15 and the cavity 16. The conductive material may be a metal such as W or Ru. The conductive material can be deposited by atomic layer deposition, so that the material fills up the portions of the cavity 16 extending outward from the foot of the trench 15. The filled cavity 16 and trench 15 form a buried rail 21 and a pad 22 that is integral with the rail 21 and located at the foot of the rail, the pad 22 extending laterally outward from the rail 21. In the vertical direction, the parts of the pad 22 that extend laterally outward from the rail 21 are lying between the front and back surfaces of the second SiGe layer 4. In other words, the pad 22 extends into the SiGe layer 4. The widths w2' and w1' indicated in FIG. 10 are the respective widths of the pad 22 and of the rail 21 at its contact plane with the pad 22. These widths are slightly smaller than the widths w1 and w2 due to the presence of the liner 20. The relation w2'>w1' is however still applicable, with w2' being significantly larger than w1', for example at least twice as large.

Figures 11, 12:
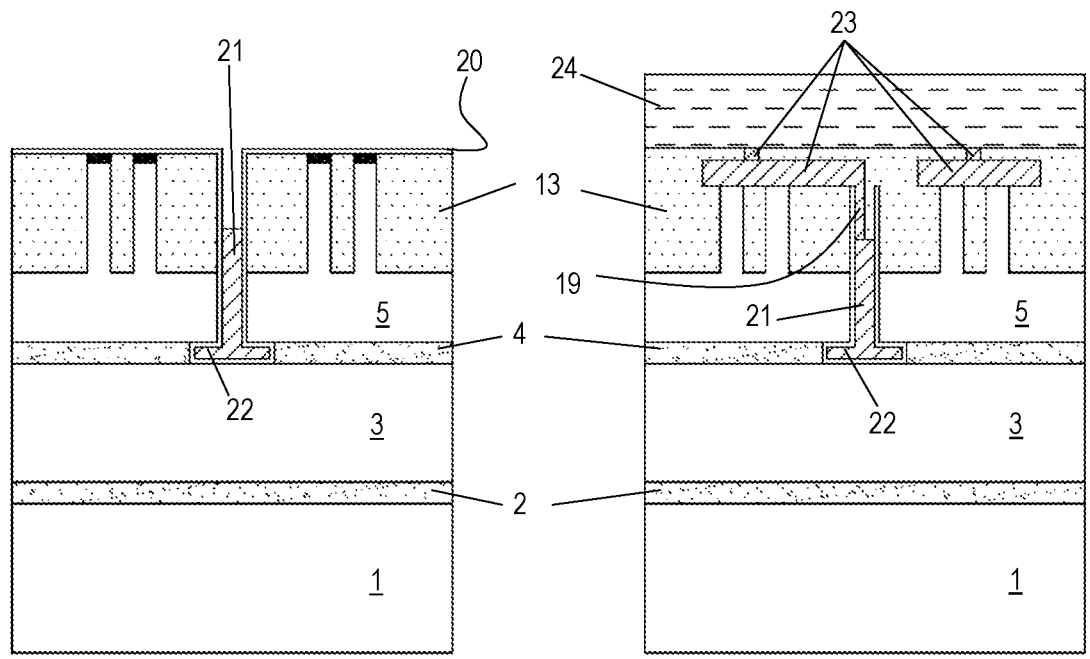

The deposited conductive material may be deposited also on the upper surface of the wafer, in which case it is subsequently removed from the upper surface. The rail 21 is then partially etched back in the trench 15, as illustrated in FIG. 11, followed by suitable front side processing steps known as front end of line (FEOL) and back end of line (BEOL) processing, the result of which is illustrated in a simplified way in FIG. 12. The FEOL processing includes the fabrication of active devices on the Si fins 12 in accordance with a given layout. No details of such devices are shown in FIG. 12, which only includes a conceptual indication of metal interconnects 23 connecting one or more of the devices to the buried rail 21 and to the BEOL stack 24 including multiple interconnect levels for routing current to and from the active devices. One of the interconnects 23 is connected to the rail 21 by a connection 19 represented as partially overlapping the rail 21 and aligned to the interconnect 23. An alternative and more commonly used connection would be a via connection between the rail 21 and the interconnect 23. Further particulars of the active devices and of their connection to the rails 21 and the BEOL stack can be suitably implemented and are not described here in further detail.

At this stage and as illustrated in FIG. 13, the wafer 10 is flipped and bonded face down to a carrier wafer (not shown). The bulk wafer 1 is then removed, as illustrated in FIG. 14. This process may include etching as well as mechanical removal techniques such as grinding and/or CMP. The end of the removal process is, however, an etch process that removes the bulk Si relative to the SiGe etch stop layer 2, that is, using an etch process that stops on the etch stop layer 2. This SiGe etch stop layer 2 is then also removed by an etch recipe for the removal of SiGe selectively with respect to Si, thereby exposing the back surface of the lower monocrystalline Si layer 3.

At this point, the stack of layers 3, 4, and 5 forms the "semiconductor substrate" of the eventual IC, that is, the substrate having a front side and a back side, with active devices formed on the front side. Processing then continues on the back side of the substrate.

By lithography and anisotropic etching, via openings 25 are then formed from this back side for contacting the pads 22 that are integral with the rails 21. One such via opening 25 is shown in FIG. 15. The via opening 25 is formed by lithography and etching, removing the silicon of layer 3 and the liner material 20 exposed at the bottom of the via opening, possibly by using different etch recipes. Prior to etching the via opening 25, a dielectric passivation layer 26 is deposited on the back side of Si layer 3. The anisotropic etch may result in vertical or slightly slanted sidewalls of the via opening 25, the latter of which is illustrated in FIG. 15. The position of the via opening 25 is chosen such that the via lands on the pad 22 formed at the foot of the rail 21. The width w3 of the via opening 25 at the contact plane with the pad 22 is seen to be larger than the width w1' of the buried rail 21 at its contact plane with the pad 22. While this is not a limitation of the disclosed technology, this width relation w3>w1' is often a reality in semiconductor processing and may lead to various problems, as described above.

The provision of the pad having a width w2' greater than both w1' and w3 can advantageously solve these problems. The overlay tolerance may be relaxed due to the larger "landing platform" at the foot of the rail 21. The assurance that the via etch lands within the boundaries of the pad 22 also reduces the chance of creating shorting between the substrate and the electrically conductive material of the rail and/or the TSV connection.

Figures 17, 18:
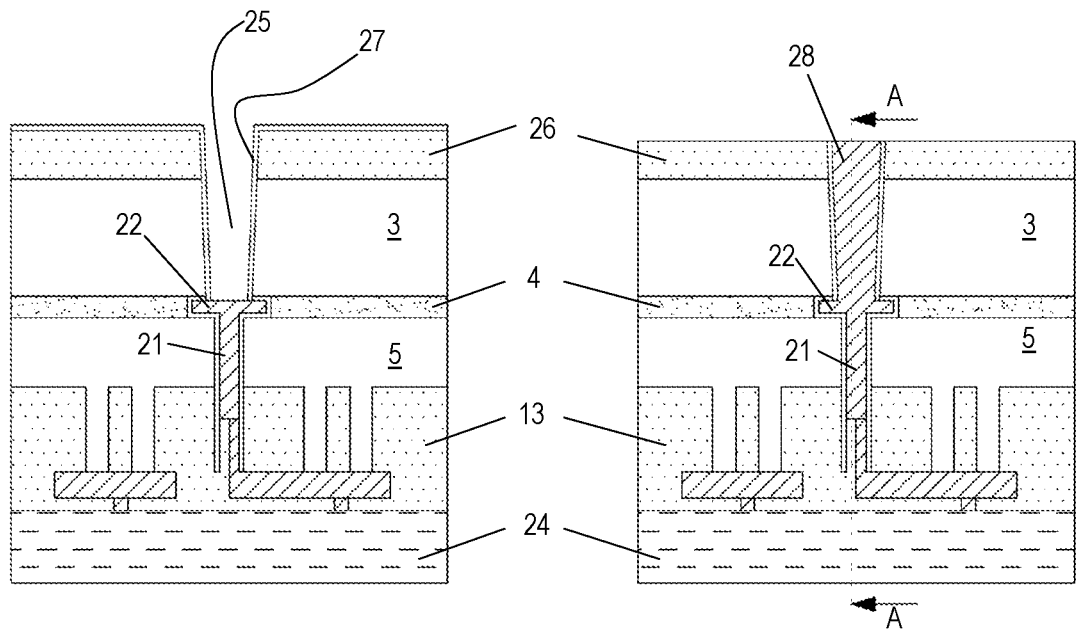

The TSV connection is produced in the next steps of the method illustrated in FIGS. 16 to 18. A dielectric liner 27 may be deposited on the inner surfaces of the via opening 25 (see FIG. 16), followed by the removal of the liner material from the bottom, while maintaining it on the sidewalls (see FIG. 17). The latter may be done by a plasma etch process, described, for example, in European Application Publication No. EP3035369A1.

The via opening 25 is then filled with an electrically conductive material such as Cu (see FIG. 18) to form a nanoTSV 28, which may involve the deposition of a barrier layer and a seed layer (not shown), and the surface of the passivation layer 26 is planarized. The result is an interconnect structure that connects the front of the IC's substrate (layers 3, 4, 5) to the back of the substrate, the structure including the buried rail 21, the contact pad 22, and the nanoTSV 28.

The disclosed technology is related to the interconnect structure as such as well as to any semiconductor component (ICs or other) including such a structure.

Figure 19:
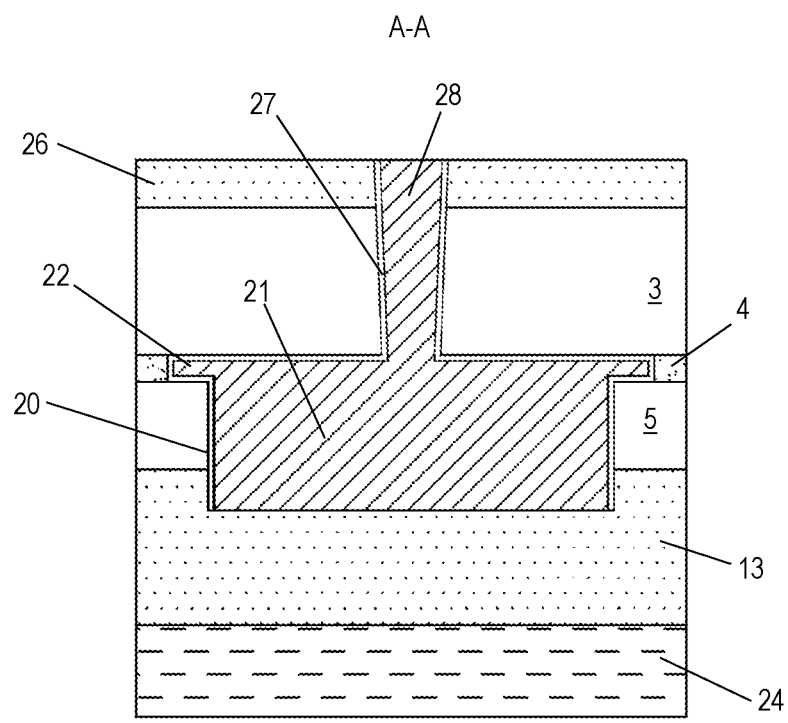

FIG. 19 shows a section view of the interconnect structure in a plane A-A perpendicular to the drawing in FIG. 18 and through the rail 21. The rail 21 forms an elongate structure having a length that could be longer than shown in this particular drawing.

Starting from the image shown in FIGS. 18 and 19, further steps for producing an integrated circuit can be suitably implemented. A back side BEOL structure is fabricated, for coupling the nanoTSV 28 to a back side terminal of the IC, for example a power supply terminal for supplying power to the active devices in the FEOL. The back side BEOL is then part of the so-called back side power delivery network (PDN) of the chip.

The disclosed technology is not limited to the embodiment involving an etch stop layer 2 although the etch stop layer may be implemented for producing a substrate of very low thickness. The material of the intermediate layer 4 is not limited to SiGe, and may be any material suitable for the performance of the method. The thickness of the intermediate layer 4 can be in the order described above, for example about 50 nm for a substrate (that is, stack of 3, 4, 5) having a thickness in the order of 200 nm to 700 nm. In any case, the intermediate layer 4 is thin compared to the substrate (3, 4, 5), so that the pad 22 forms a planar extension of the rail, that is, a rather flat shape extending laterally at the foot of the rail, and extending into the intermediate layer 4.

If the etch stop layer 2 is not present, the "base portion" could be a bulk monocrystalline wafer or a stack of a bulk non-monocrystalline wafer with a monocrystalline layer on top (without an etch stop layer in between the two). Thinning of the "base portion" 11 may then take place, for example, by a timed etch, resulting in the configuration shown in FIG. 14, after which the subsequent steps are performed as described above.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. An interconnect structure of a semiconductor component comprising a semiconductor substrate having a front side and a backside, the structure enabling to electrically connect the front side of the substrate to the backside, wherein:
    the semiconductor substrate is formed as a stack of a lower semiconductor layer, an intermediate layer, and an upper semiconductor layer, wherein the intermediate layer comprises a SiGe layer; and
    the interconnect structure comprises:
        a rail formed inside a trench through a complete thickness of the upper layer,
        a laterally extending pad at afoot of the rail, the pad extending into the intermediate layer, and
        a TSV connection extending from the pad to the backside of the semiconductor substrate.

2. A method of producing the interconnect structure of claim 1, the method comprising:
    providing a semiconductor wafer, comprising a base portion, an intermediate layer on top of the base portion, and an upper semiconductor layer on top of the intermediate layer;
    producing a trench extending through a complete thickness of the upper semiconductor layer, and optionally further extending partially into the intermediate layer;
    removing material of the intermediate layer selectively with respect to the upper semiconductor layer, by isotropically etching the intermediate layer material from inside the trench, to thereby form a cavity at a foot of the trench, the cavity forming a lateral extension of the trench;
    filling the trench and the cavity with an electrically conductive material, thereby forming a buried rail and integral with the rail, a laterally extending pad at the foot of the rail;
    thinning the base portion from the back side until a lower semiconductor layer remains, wherein the semiconductor substrate is formed by a stack of the lower layer, the intermediate layer, and the upper layer;
    producing a via opening through the lower semiconductor layer, the via opening landing on the pad extending at the foot of the rail; and
    filling the via opening with an electrically conductive material, thereby forming the interconnect structure comprising the buried rail, the pad and a TSV connection extending form the pad to the back side of the semiconductor substrate.

3. The method according to claim 1, further comprising:
    depositing a dielectric liner on inner surfaces of the trench and of the cavity, before filling the trench and the cavity with the conductive material; and
    depositing a dielectric liner on inner surfaces of the via opening, followed by removing the liner from a bottom of the via opening, before filling the via opening with the conductive material.

4. The method according to claim 2, wherein the base portion of the semiconductor wafer comprises a bulk wafer, an etch stop layer on top of the bulk wafer and the lower semiconductor layer on top of the etch stop layer, wherein the etch stop layer is configured to stop at least one etch process for removing the material of the bulk wafer from the back side of the bulk wafer, and wherein thinning the base portion comprises:

thinning the bulk wafer by a thinning sequence that ends with an etch process that stops on the etch stop layer; and removing the etch stop layer.

5. The method according to claim 4, wherein the upper and lower layers comprise silicon layers and wherein the intermediate layer and the etch stop layer comprise SiGe layers.

6. The method according to claim 2, wherein the upper and lower layers comprise silicon layers and wherein the intermediate layer comprises a SiGe layer.

7. The interconnect structure of claim 1, wherein the upper and lower semiconductor layers comprise silicon layers.

8. A semiconductor component comprising one or more interconnect structures of claim 1.

9. An integrated circuit chip comprising one or more interconnect structures of claim 1.

* * * * *

UNITED STATES PATENT AND TRADEMARK OFFICE
CERTIFICATE OF CORRECTION

PATENT NO. : 12,494,424 B2  
APPLICATION NO. : 17/991351  
DATED : December 9, 2025  
INVENTOR(S) : Gaspard Hiblot et al.

Page 1 of 1

It is certified that error appears in the above-identified patent and that said Letters Patent is hereby corrected as shown below:

In the Claims

At Column 8, Claim 1, Line 7, delete "a backside, the" and replace with "a back side, the".

At Column 8, Claim 1, Line 8, delete "a backside, the" and replace with "a back side, the".

At Column 8, Claim 1, Line 17, delete "at afoot of" and replace with "at a foot of".

At Column 8, Claim 1, Line 19, delete "the backside" and replace with "the back side".

At Column 8, Claim 3, Line 52, delete "claim 1, further" and replace with "claim 2, further".

Signed and Sealed this  
Twentieth Day of January, 2026

John A. Squires  
*Director of the United States Patent and Trademark Office*